US012635486B2

(12) United States Patent
Chen et al.

(10) Patent No.: US 12,635,486 B2
(45) Date of Patent: May 19, 2026

(54) SEMICONDUCTOR DEVICE AND MANUFACTURING METHOD THEREOF

(71) Applicant: NEXCHIP SEMICONDUCTOR CORPORATION, Hefei (CN)

(72) Inventors: Wei Pang Chen, Taiwan (CN);
Chih-Nan Wu, Taiwan (CN);
Chi-Cherng Jeng, Taiwan (CN)

(73) Assignee: NEXCHIP SEMICONDUCTOR CORPORATION, Hefei (CN)

( * ) Notice: Subject to any disclaimer, the term of this patent is extended or adjusted under 35 U.S.C. 154(b) by 464 days.

(21) Appl. No.: 18/187,690

(22) Filed: Mar. 22, 2023

(65) Prior Publication Data

US 2023/0411204 A1      Dec. 21, 2023

(30) Foreign Application Priority Data

Jun. 21, 2022    (CN) ........................ 202210701263.X

(51) Int. Cl.
H01L 21/762 (2006.01)
H10D 62/10 (2025.01)
(52) U.S. Cl.
CPC ..... H01L 21/76224 (2013.01); H10D 62/116 (2025.01)
(58) Field of Classification Search
None
See application file for complete search history.

(56) References Cited

U.S. PATENT DOCUMENTS

| | | | |
|---|---|---|---|
| 2010/0109048 A1 | 5/2010 | Steegen et al. | |
| 2012/0248511 A1 | 10/2012 | Guo et al. | |
| 2012/0292735 A1 | 11/2012 | Tan | |
| 2014/0070327 A1 | 3/2014 | Niimi et al. | |
| 2014/0124842 A1 | 5/2014 | Wang et al. | |
| 2015/0061029 A1 | 3/2015 | Sui et al. | |
| 2018/0151414 A1 | 5/2018 | Wu et al. | |
| 2018/0366580 A1* | 12/2018 | Zhou ...................... | H01L 21/324 |
| 2020/0295009 A1* | 9/2020 | Lu .......................... | H10B 12/37 |
| 2022/0115508 A1* | 4/2022 | Lin .................... | H10D 84/0142 |
| 2022/0399447 A1* | 12/2022 | Akaiwa .............. | H10D 84/0186 |

FOREIGN PATENT DOCUMENTS

| | | |
|---|---|---|
| CN | 106033744 A | 10/2016 |
| CN | 106373924 A | 2/2017 |
| EP | 0513639 A2 | 11/1992 |

(Continued)

*Primary Examiner* — Steven B Gauthier
*Assistant Examiner* — Lamont B Koo

(57) ABSTRACT

A semiconductor device and a manufacturing method is provided. The semiconductor device includes a substrate, a shallow trench isolation structure, a dielectric layer, a gate, a source and a drain. The substrate includes a first region and a second region. The shallow trench isolation structure is arranged on the first region and the second region, and the shallow trench isolation structure is lower than a surface of the substrate and forms an opening. The dielectric layer is arranged in the opening and on the substrate, and a height of the dielectric layer in the second region is greater than that in the first region. The gate is arranged on the dielectric layer. The source is arranged on the substrate and located on a side of the gate. The drain is arranged on the substrate and located on the other side of the gate.

16 Claims, 7 Drawing Sheets

(56)         References Cited

FOREIGN PATENT DOCUMENTS

| JP | H118383 A | 1/1999 |
|----|-----------|--------|
| JP | 2000195969 A | 7/2000 |
| JP | 2007227851 A | 9/2007 |
| JP | 2009503892 A | 1/2009 |
| JP | 2014063895 A | 4/2014 |

* cited by examiner

SEMICONDUCTOR DEVICE AND MANUFACTURING METHOD THEREOF

TECHNICAL FIELD

The disclosure relates to the technical field of semiconductors, particularly to a semiconductor device and a manufacturing method thereof.

BACKGROUND

With the continuous improvement of the integration level of semiconductor devices, a general trend of semiconductor devices is miniaturization of semiconductor devices. And it is often necessary to integrate multiple types of devices together for manufacture, for example, different types of transistors are manufactured on the same substrate, and the different transistors are isolated by shallow trench isolation structures. However, the smaller the size of the transistor, the transistor is prone to many problems, such as gate current leakage, boron penetration effect, and depressions in the shallow trench isolation structure at the edge of the transistor, etc., which cause the electrical attenuation of the transistor and reduce the effect of the semiconductor device.

Therefore, how to obtain high-performance semiconductor devices has become an urgent problem to be solved.

SUMMARY

The disclosure provides a semiconductor device and a manufacturing method thereof, which may improve comprehensive performances of the semiconductor device.

The disclosure provides the semiconductor device, including:

a substrate, comprising a first region and a second region;

a shallow trench isolation structure, arranged on the first region and the second region, being lower than a surface of the substrate and forming an opening;

a dielectric layer, arranged in the opening and on the substrate, and a height of the dielectric layer in the second region being greater than a height of the dielectric layer in the first region;

a gate, arranged on the dielectric layer;

a source, arranged on the substrate and located on a first side of the gate; and a drain, arranged on the substrate and located on a second side of the gate.

In an embodiment of the disclosure, the shallow trench isolation structure is 10 nm to 30 nm lower than the surface of the substrate.

In an embodiment of the disclosure, the semiconductor device further includes a sidewall structure, the sidewall structures are located on both sides of the gate, and the sidewall structures are located on the dielectric layer.

In an embodiment of the disclosure, the sidewall structure is a single insulating layer or a stacked structure of an insulating layer with a strained layer.

In an embodiment of the disclosure, the semiconductor device further includes a passivation protection layer, and the passivation protection layer is arranged on the gate, the sidewall structure and the dielectric layer.

In an embodiment of the disclosure, the gate includes a first metal gate, and a strained region is arranged in the substrate on both sides of the first metal gate.

In an embodiment of the disclosure, the strained region extends toward a bottom of the first metal gate and extends to a connection between the sidewall structure and the first metal gate.

In an embodiment of the disclosure, the gate comprises a second metal gate, and a light doping region is arranged in the substrate on both sides of the second metal gate.

In an embodiment of the disclosure, a thickness of the dielectric layer in the first region is from 2 nm to 5 nm, and a thickness of the dielectric layer in the second region is from 4 nm to 8 nm.

In an embodiment of the disclosure, the gate is a single-layer metal, a multi-layer metal, or a stacked structure of a metal with a metal compound.

The disclosure further provides the manufacturing method of the semiconductor device, including:

providing a substrate comprising a first region and a second region;

forming a plurality of shallow trench isolation structures on the first region and the second region;

when removing a pad oxide layer on the substrate, prolonging an etching time to remove part of the shallow trench isolation structure;

forming an opening lower than a surface of the substrate on the shallow trench isolation structure;

forming a dielectric layer in the opening and on the substrate, and a height of the dielectric layer in the second region being greater than a height of the dielectric layer in the first region;

forming a gate on the dielectric layer;

forming a source on the substrate, and the source being located on a first side of the gate; and forming a drain on the substrate, and the drain being located on a second side of the gate.

The disclosure provides the semiconductor device and the manufacturing method thereof, which can reduce an edge depression phenomenon of the shallow trench isolation structure and improve an electrical performance of the semiconductor device. In a preparation process, the number of photomasks is not added, a production process is simplified, and a cost is reduced. Moreover, an effective width of the semiconductor device may be increased, and an efficiency of the semiconductor device may be increased. In summary, the disclosure provides the semiconductor device and the manufacturing method thereof, which may improve the performances of the semiconductor device.

Of course, any embodiment implementing the disclosure does not necessarily need to achieve all the above-mentioned advantages at the same time.

BRIEF DESCRIPTION OF THE DRAWINGS

In order to explain the technical solutions of the embodiments of the disclosure more clearly, the following will briefly introduce the drawings used in the description of the embodiments. Obviously, the drawings in the following description are only some embodiments of the disclosure. For those of ordinary skill in the art, other drawings can be obtained from these drawings without creative work.

PART NUMBER DESCRIPTION

Figure 1:
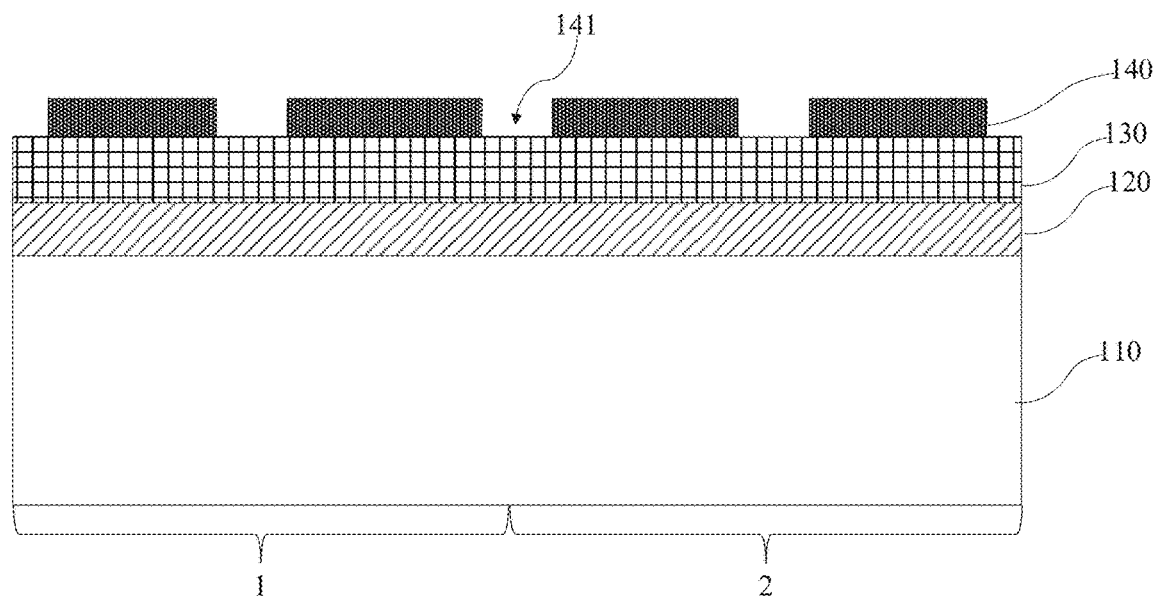
FIG. 1 is a schematic view of a substrate distribution in an embodiment.

110—substrate; 111—interface layer; 120—pad oxide layer; 130—pad nitride layer; 140—patterned photoresist layer; 141—first depression part; 150—shallow trench isolation structure; 160—first well region; 170—second well region; 180—dielectric layer; 190—pseudo gate; 191—protection layer; 192—polysilicon layer; 193—shielding layer; 194—anti-reflection layer; 200—sidewall structure; 201—first insulating layer; 202—first strained layer; 203—second insulating layer; 204—second strained layer; 210—light doping region; 220—strained region, 230—self-aligned block; 240—first metal gate; 241—first blocking layer; 242—first work function metal layer; 243—first metal conductive layer; 250—second metal gate; 251—second blocking layer; 252—second work function metal layer; 253—second metal conductive layer; 260—metal gate; 270—passivation protection layer; 280—insulating layer; 11—opening; 12—groove; 13—trench; 14—second depression part; 21—source; 22—gate; 23—drain.

DETAILED DESCRIPTION

The following describes the implementation of the disclosure through specific embodiments, and those skilled in the art can easily understand other advantages and effects of the disclosure from the content disclosed in this specification. The disclosure may also be implemented or applied through other different specific embodiments. Various details in this specification may also be modified or changed based on different viewpoints and applications without departing from the disclosure.

It should be noted that figures provided in these embodiments only illustrate a basic idea of the disclosure in a schematic manner. The figures only show the assemblies related to the disclosure instead of drawing according to number, shape and size of the assemblies in actual implementation. In its actual implementation, type, quantity, and ratio of each assembly may be changed at will, and its assembly layout type may also be more complicated.

In the disclosure, it should be noted that if the terms "center", "upper", "lower", "left", "right", "vertical", "horizontal", "inner", "outer" etc., an orientation or positional relationship indicated is based on an orientation or positional relationship shown in the drawings, and is only for a convenience of describing the disclosure and simplifying the description. It is not intended to indicate or imply that a device or components referred to must have a particular orientation, be constructed, or be operated in a particular orientation, which should not be construed as a limitation of the disclosure. In addition, the terms such as "first" and "second" are only used for description and distinction, and should not be understood as indicating or implying relative importance.

The disclosure provides a semiconductor device and a manufacturing method thereof. The semiconductor devices with different functions may be manufactured in different regions of the same substrate, and each semiconductor device has excellent performance. Moreover, the manufacturing method of the semiconductor device provided by the disclosure may be widely used in a manufacturing process of various tiny semiconductor devices.

Please refer to FIG. 1. In an embodiment of the disclosure, for example, a substrate 110 includes a first region 1 and a second region 2, a plurality of metal-oxide-semiconductor field-effect transistors (MOS) may be arranged in the first region 1 and the second region 2, such as positive channel metal oxide semiconductor (PMOS) transistors and negative channel metal oxide semiconductor (NMOS) transistors, and the PMOS transistors and the NMOS transistors are arranged alternately. Through manufacturing semiconductor devices in different regions of the same substrate, a production efficiency is improved and a production cost is reduced.

Please refer to FIG. 1. In an embodiment of the disclosure, first, the substrate 110 is provided, and the substrate 110 may be any suitable material, such as a silicon wafer, a germanium substrate, silicon germanium, silicon-on-insulator, or layered silicon-on-insulator. The disclosure does not limit a type and a thickness of the substrate 110. In this embodiment, the substrate 110 is, for example, a silicon wafer for illustration, and the substrate 110 is, for example, a P-type silicon wafer. The substrate 110 includes, for example, the first region 1 and the second region 2. Wherein, in the first region 1, for example, a Core MOS transistor used inside the device is arranged, and it generally has a relatively low working voltage. For example, the second region 2 is provided with an edge metal oxide semiconductor field effect transistor corresponding to the Core MOS transistor, that is, an IO MOS transistor, which is generally used for an interaction between a chip and an external port, and has a higher working voltage than that of the Core MOS transistor. In this embodiment, where the first region 1 includes a PMOS transistor and an NMOS transistor and the second region 2 includes a PMOS transistor and an NMOS transistor is taken as an example, the PMOS transistors and the NMOS transistors are alternately distributed, and the PMOS transistors and the NMOS transistors are isolated by shallow trench isolation structures.

Please refer to FIG. 1. In an embodiment of the disclosure, a plurality of shallow trench isolation structures are formed on the substrate 110. Specifically, a pad oxide layer 120 is formed on the substrate 110, and the pad oxide layer 120 is, for example, a material such as dense silicon oxide. The pad oxide layer 120 may be manufactured, for example, by thermal oxidation, in-situ steam generation, or chemical vapor deposition (CVD). A pad nitride layer 130 is formed on the pad oxide layer 120, and the pad nitride layer 130 is, for example, silicon nitride or a mixture of silicon nitride and silicon oxide. The pad nitride layer 130 may be formed by the chemical vapor deposition or other methods. In a process of forming the shallow trench isolation structure, the pad oxide layer 120 may improve a strain between the substrate 110 and the pad oxide layer 120, and at the same time, it may protect the substrate 110 and prevent the substrate 110 from being damaged by high-energy ions when ion implantation is performed to form a well region. A patterned photoresist layer 140 is formed on the pad nitride layer 130, a plurality of first depression parts 141 are arranged on the patterned photoresist layer 140, the first depression parts 141 are used to define a position of the shallow trench isolation structure, and the first depression parts 141 expose the pad nitride layer 130.

Figure 2:
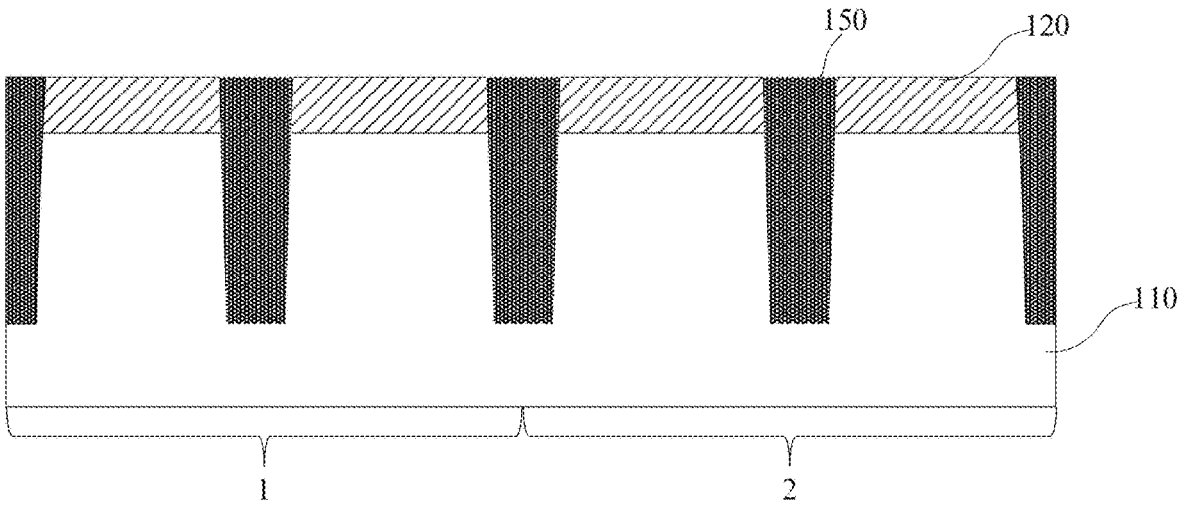
FIG. 2 is a schematic structural view of a shallow trench isolation structure in an embodiment.

Please refer to FIG. 1 and FIG. 2. In an embodiment of the disclosure, after forming the patterned photoresist layer 140, the patterned photoresist layer 140 is used as a mask, for example, a dry etching is used to etch toward a direction of the substrate 110 to form shallow trenches, and etching gas may be, for example, one or a mixture of chlorine ($Cl_2$), trifluoromethane ($CHF_3$), difluoromethane ($CH_2F_2$), nitrogen trifluoride ($NF_3$), sulfur hexafluoride ($SF_6$) or hydrogen bromide (HBr) and the like. A lining oxide layer (not shown in the figure) is formed in the shallow trench, for example, by a thermal oxidation method, so as to repair an etching damage during a formation process of the shallow trench and reduce an electric leakage of the semiconductor device. An isolation medium 151 is deposited in shallow trenches by means of, for example, high density plasma chemical vapor deposition (HDP-CVD) or high aspect ratio process chemical vapor deposition (HARP-CVD) and so on, and the isolation medium 151 is, for example, an insulating material such as silicon oxide. After the deposition of the isolation medium 151 is completed, for example, the isolation medium 151 and the pad nitride layer 130 are planarized by a chemical mechanical polishing (CMP) process to form the shallow trench isolation structure 150, and the shallow trench isolation structure 150 is flush with the pad oxide layer 120 on both sides.

Figure 3:
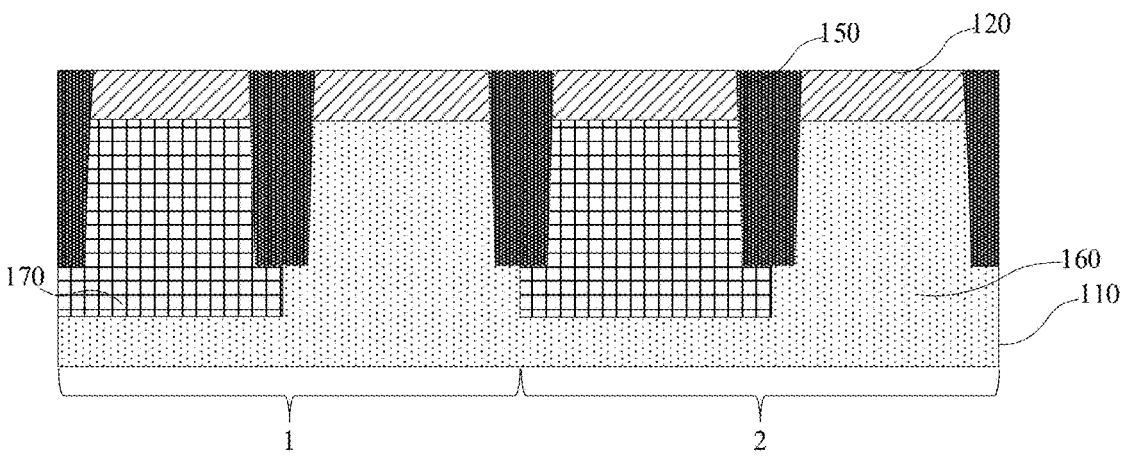
FIG. 3 is a schematic view of a well region distribution in an embodiment.

Please refer to FIG. 3. In an embodiment of the disclosure, after the shallow trench isolation structure 150 is manufactured, an ion implantation is performed on the substrate 110 to form different well regions. Firstly, a doping region with a concentration higher than that of the substrate 110 is implanted with high implantation energy, which means that a first well region 160 is formed in the substrate 110. Doping ions with a concentration higher than that of the first well region 160 are implanted with high implantation energy in the region where the NMOS transistor is formed to form a second well region 170, and the second well region 170 is located on part of the first well region 160. In an embodiment, types of the first well region 160 and the second well region 170 are different. Wherein, the first well region 160 is, for example, set as an N-type deep well, and doping ions are phosphorus (P), arsenic (As), aluminum (Al) or the like, and the second well region 170 is, for example, set as a P-type deep well and doping ions are boron (B) or gallium (Ga), etc. After the first well region 160 and the second well region 170 are formed, a Rapid Thermal Anneal (RTA) process is performed on the first well region 160 and the second well region 170. In this embodiment, an annealing temperature is, for example, from 1000° C. to 1400° C., an annealing time is, for example, from 1 h to 3h, and an annealing process is performed in a stable gas, such as nitrogen. Through the annealing process, ions in the first well region 160 and the second well region 170 are implanted to a proper depth, and at the same time, an anti-avalanche breakdown capability of the semiconductor device is improved.

Figure 4:
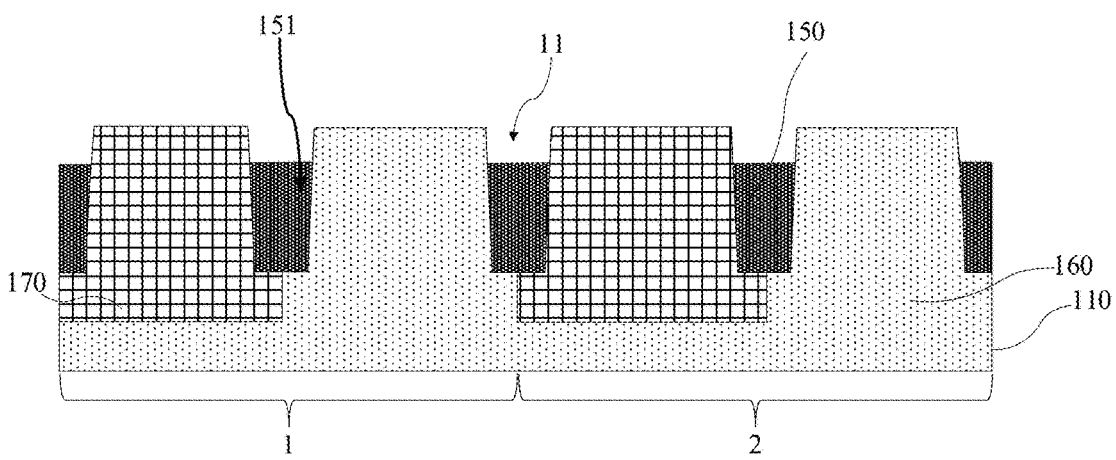
FIG. 4 is a schematic view of an opening in an embodiment.

Please refer to FIG. 3 and FIG. 4. In an embodiment of the disclosure, after the first well region 160 and the second well region 170 are formed, the pad oxide layer 120 is removed. In this embodiment, for example, the pad oxide layer 120 is removed by wet etching, and a wet etching solution is, for example, hydrofluoric acid, and an etching is performed at a normal temperature. In other embodiments, other etching methods may also be used, which are selected according to specific manufacturing requirements. At the same time, when removing the pad oxide layer 120, the etching time is extended to remove part of the isolation medium 151 in the shallow trench isolation structure 150 to form an opening 11, and a depth of the opening 11 is, for example, from 10 nm to 30 nm, which means that after etching, a lower surface of the opening 11 is lower than a surfaces of the substrate 110 on both sides, and a height difference is, for example, from 10 nm to 30 nm. Through arranging the opening 11, it is possible to avoid forming a depression at an edge of the shallow trench isolation structure 150 when removing the pad oxide layer 120, thereby reducing an occurrence of the electric leakage and improving an electrical performance of the semiconductor device. At the same time, a removal of the pad oxide layer 120 and a formation of the opening 11 are formed in the same process, the number of photomasks remains unchanged, operations of photoresist and etching are not increased, and the cost is reduced.

Figure 5:
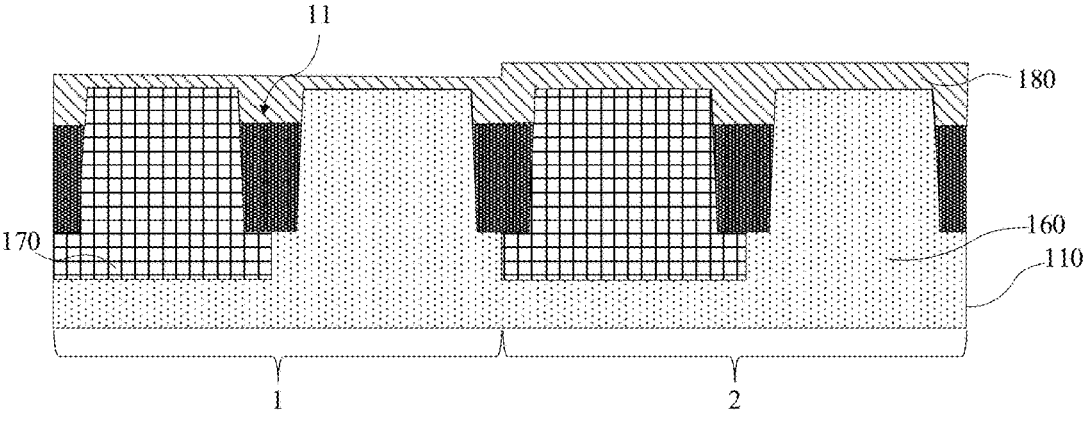
FIG. 5 is a schematic view of a dielectric layer in an embodiment.
Figure 15:
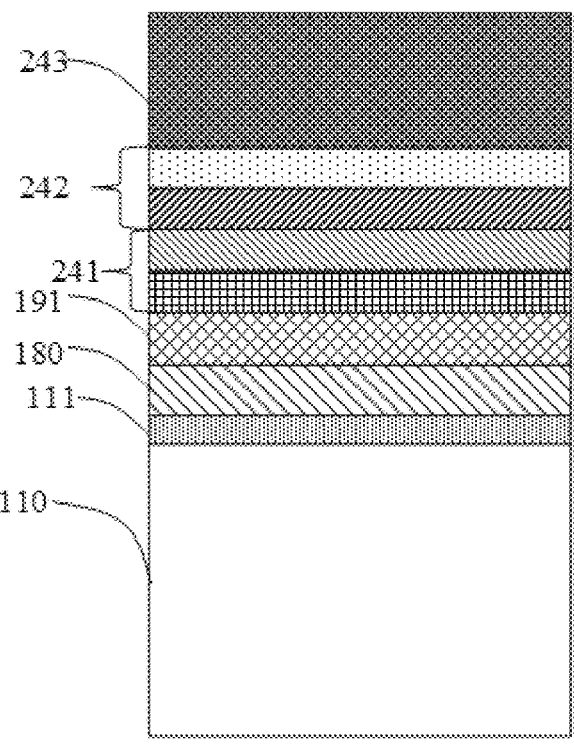
FIG. 15 is a schematic structural view of a first metal gate on a substrate in an embodiment.

Please refer to FIG. 5 and FIG. 15. In an embodiment of the disclosure, after the opening 11 is formed, a high dielectric constant material is deposited in the opening 11 and on the substrate 110 to form a dielectric layer 180 as a gate dielectric layer of the semiconductor device. In this embodiment, the dielectric layer 180 may be formed, for example, through atomic layer deposition (ALD), metal-organic chemical vapor deposition (MOCVD), molecular beam epitaxy (MBE), chemical vapor deposition or physical vapor deposition (PVD) and other methods. And the dielectric layer 180 is, for example, one or a mixture of hafnium oxide ($HfO_2$), hafnium oxynitride (HfON), zirconium oxide ($ZrO_2$), zirconium oxynitride (ZrON), zirconium oxynitride silicate (ZrSiON), hafnium silicate (HfSiO), hafnium oxynitride silicate (HfSiON), lanthanum hafnium oxynitride (HfLaON) or hafnium aluminum oxide (HfAlO). Since the dielectric layer 180 is made of the high dielectric constant material, a quality of an interface with the substrate 110 is poor. Therefore, before depositing the dielectric layer 180, for example, an interface layer 111 is formed on the substrate 110 and a side wall of the opening 11 by using in-situ steam generation (ISSG), and a thickness of the interface layer 111 is, for example, from 0.5 nm to 1.5 nm to improve an interface quality between the dielectric layer 180 and the substrate 110. After a deposition of the dielectric layer 180 is completed, the dielectric layer 180 is planarized. Since an operating voltage of transistors in the second region 2 is higher, a remaining thickness of the dielectric layer 180 is different in the first region 1 and the second region 2. In this embodiment, the thickness of the dielectric layer 180 on the well region of the first region 1 is, for example, from 2 nm to 5 nm, and the thickness of the dielectric layer 180 on the well region of the second region 2 is, for example, from 4 nm to 8 nm, which may improve a voltage resistance of the transistor on the second region 2. Through arranging the opening 11 and the dielectric layer 180, an effective width of a subsequent transistor is increased, thereby improving the performance of the device and reducing a phenomenon of electric leakage.

Figure 6:
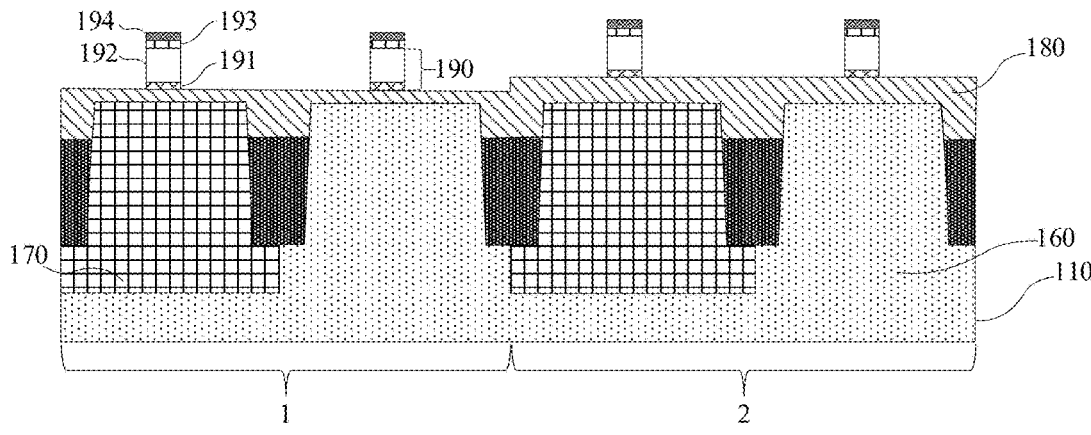
FIG. 6 is a schematic view of a pseudo gate in an embodiment.

Please refer to FIG. 6. In an embodiment of the disclosure, after the dielectric layer 180 is formed, a pseudo gate 190 is formed on the dielectric layer 180. Specifically, a protection layer 191, a polysilicon layer 192, a shielding layer 193 and an anti-reflection layer 194 are sequentially formed on the dielectric layer 180. In this embodiment, the protection layer 191 is, for example, titanium nitride, and the protection layer 191 is prepared by, for example, an atomic layer deposition. Through arranging the protection layer 191, the dielectric layer 180 may be prevented from being polluted or damaged in a subsequent preparation process, and a performance of a metal gate prepared subsequently may be improved. The polysilicon layer 192 is, for example, an N-type doped polysilicon layer, which may increase a removal rate of the polysilicon layer 192 in subsequent processes. The shielding layer 193 is, for example, one or more of silicon nitride, titanium nitride, or silicon carbide nitride. The anti-reflection layer 194 is, for example, a reflective material such as silicon oxynitride, so as to ensure a structural integrity of the pseudo gate 190 during a process of forming the pseudo gate 190. A patterned photoresist layer (not shown) is formed on the anti-reflection layer 194, and then the anti-reflection layer 194, the shielding layer 193, the polysilicon layer 192 and the protection layer 191 are etched. And the dielectric layer 180 is used as an etching stop layer, a stacked columnar structure is formed on the dielectric layer 180, the shielding layer 193 and the anti-reflection layer 194 are removed, the pseudo gate 190 is formed on the dielectric layer 180, and the pseudo gate 190 is located on the first well region 160 and the second well region 170.

Figure 7:
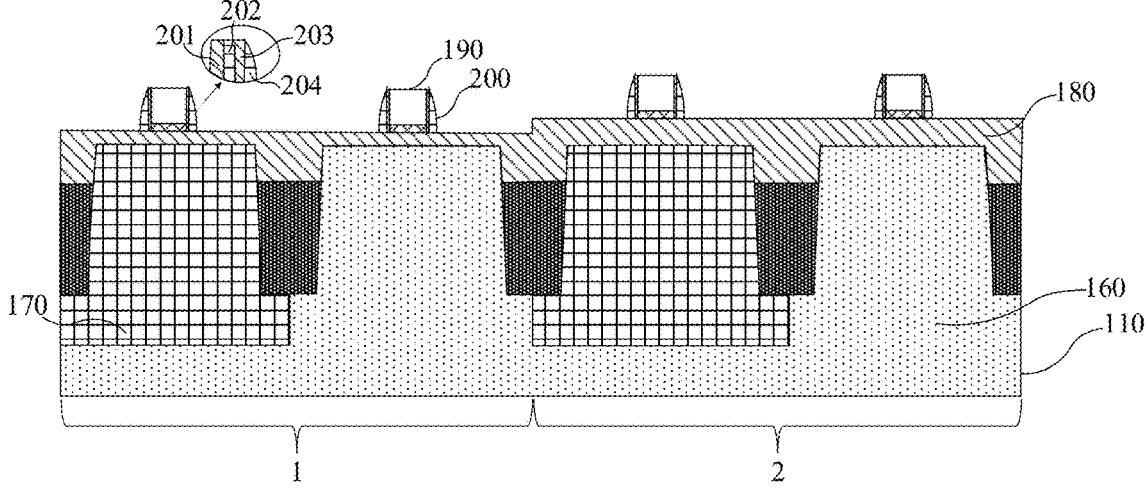
FIG. 7 is a schematic view of a sidewall structure in an embodiment.

Please refer to FIG. 7. In an embodiment of the disclosure, after the pseudo gate 190 is formed, sidewall structures 200 are formed on both sides of the pseudo gate 190, which means that the sidewall structures 200 are formed on the sides of the pseudo gate 190, and the sidewall structures 200 are located on the dielectric layer 180. An edge of the sidewall structure 200 overlaps with an edge of the dielectric layer 180 located under the pseudo gate 190. In this embodiment, the sidewall structure 200 is a stacked structure, wherein the sidewall structure 200 includes, for example, a first insulating layer 201, a first strained layer 202, a second insulating layer 203, and a second strained layer 204, and the insulating layer is, for example, silicon oxide or the like, and the strained layer is, for example, silicon nitride or the like. It means that the sidewall structure 200 is a stacked layer of silicon oxide layer/silicon nitride layer, wherein the strained layer may ensure a stability of the sidewall structure during a process of removing the pseudo gate 190, and reduce an uneven subsequent gate deposition caused by an internal inclination of the sidewall structure, which improves a uniformity of the gate structure, thereby improving a stability of a threshold voltage of the semiconductor structure. In other embodiments, the sidewall structure 200 may also be a single insulating layer or other structures. Through arranging the sidewall structure as a multi-layer structure, a loss of the sidewall structure in subsequent manufacturing processes is reduced.

Figure 8:
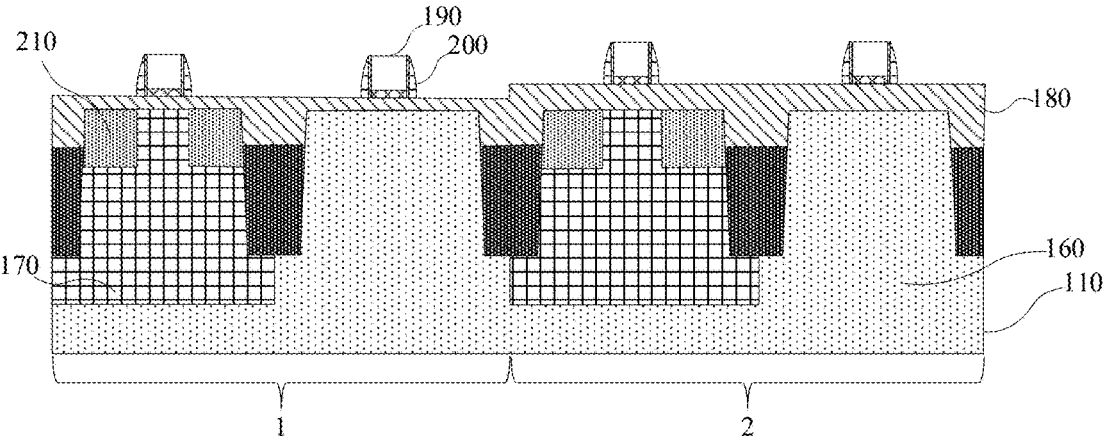
FIG. 8 is a schematic structural view of a light doping region in an embodiment.
Figure 9:
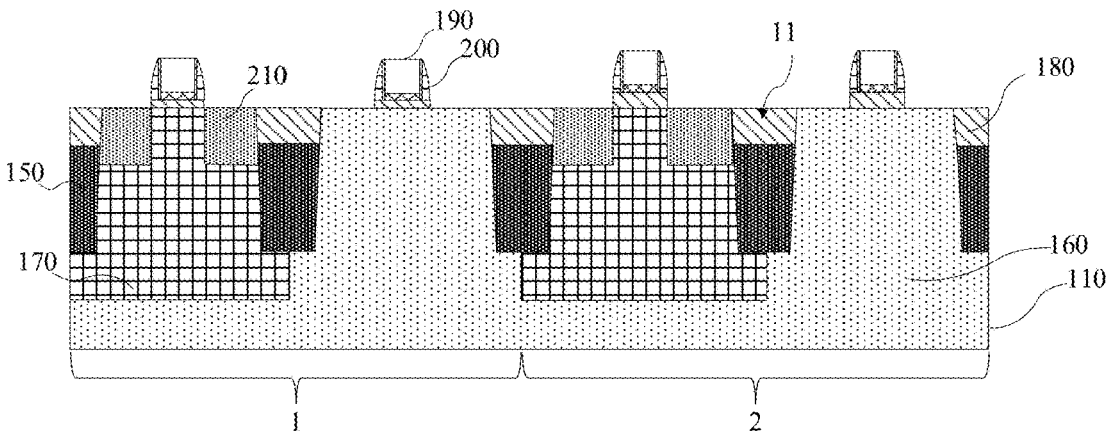
FIG. 9 through FIG. 11 are schematic views of forming a strained region in an embodiment.

Please refer to FIG. 8 and FIG. 9. In an embodiment of the disclosure, after the sidewall structure 200 is formed, a light doping region 210 is formed in the second well region 170, and the light doping region 210 is located between the sidewall structure 200 and the shallow trench isolation structure 150 and is adjacent to the sidewall structure 200 and the shallow trench isolation structure 150, so as to improve a short channel effect of a formed transistor. Specifically, dopant ions are implanted with relatively low implantation energy, so the formed lightly doped region 210 is located at a side of the second well region 170 close to the dielectric layer 180. Wherein, the implanted dopant ions are, for example, N-type ions such as phosphorus, arsenic or aluminum, and the light doping region 210 may be used as a source or a drain region of an NMOS transistor. After forming the light doping region 210, the dielectric layer 180 on the shallow trench isolation structure 150, the first well region 160, and the second well region 170 is removed, and the dielectric layer 180 in an area covered by the pseudo gate 190 and the sidewall structure 200 remains, the dielectric layer 180 in the opening 11 remains, and the dielectric layer 180 in the opening 11 is flush with the substrate 110. In this embodiment, the dielectric layer 180 may be removed by dry etching, wet etching or a combination of dry etching and wet etching. Through removing the dielectric layer 180 after the light doping region 210 is formed, a damage to the second well region 170 may be prevented when the light doping region 210 is formed, thereby improving performances of the semiconductor device.

Figure 10:
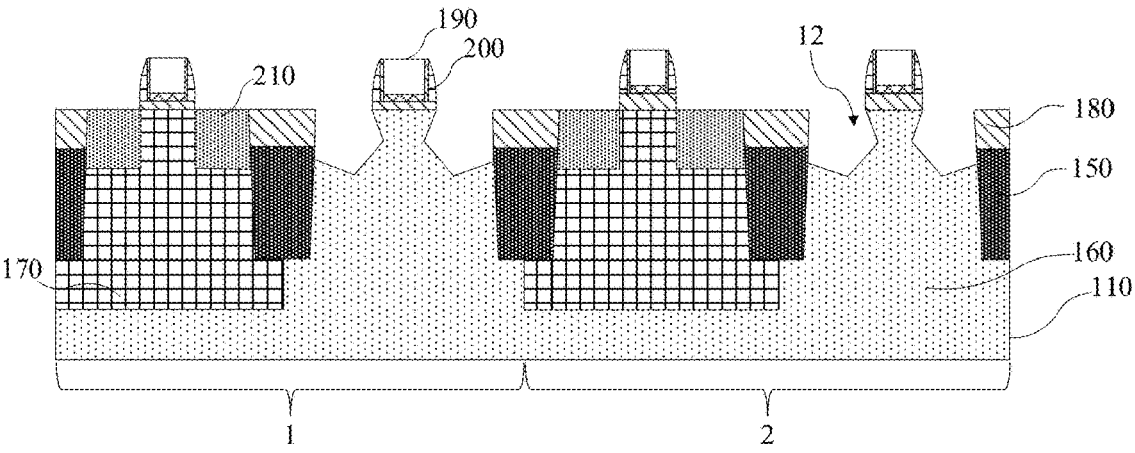
Figure 11:
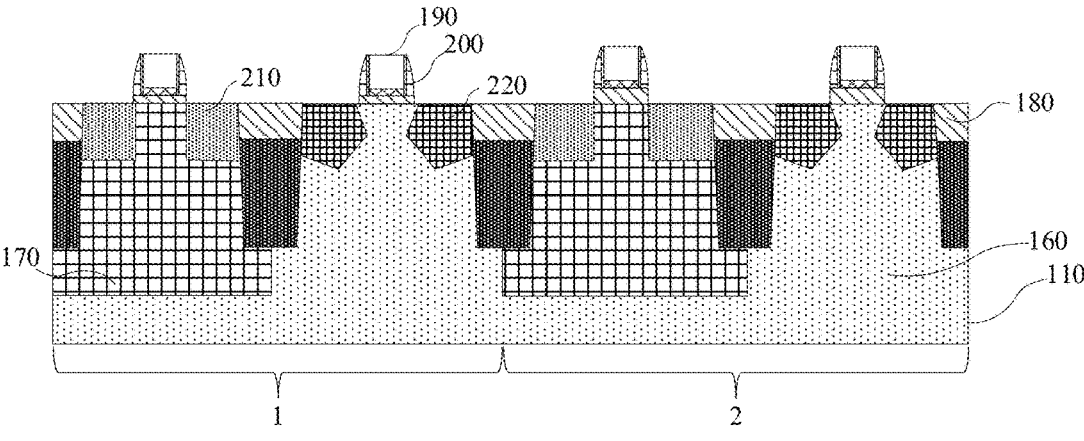

Please refer to FIG. 10 through FIG. 11. In an embodiment of the disclosure, after removing the dielectric layer 180, a groove 12 is formed on the first well region 160, and the groove 12 is located between the sidewall structure 200 and the shallow trench isolation structure 150 and is adjacent to the sidewall structure 200 and the shallow trench isolation structure. Specifically, a patterned photoresist layer (not shown) is formed on the substrate 110. The groove 12 is formed by dry etching or wet etching the substrate 110 on both sides of the sidewall structure 200 on the first well region 160. In this embodiment, a sidewall of the groove 12 is arranged in an open polygonal shape, which may expand a contact area between a subsequently deposited strained region 220 and a channel region of the transistor, and increase a strain on the channel region, thereby improving a migration rate in the channel region. A semiconductor material is deposited in the groove 12 to form the strained region 220, and the strained region 220 may be used as a source region or a drain region of a PMOS transistor. In this embodiment, the strained region 220 is, for example, silicon germanium (SiGe), and SiGe is a kind of SiGe doped with P-type impurities. Wherein, a shape of the strained region 220 is consistent with a shape of the groove 12, such as a polygon, and one side of the polygon is adjacent to the shallow trench isolation structure 150. The strained region 220 extends to a bottom of the pseudo gate 190 and extends to a connection between the sidewall structure 200 and the pseudo gate 190. Through arranging the strained region 220 to extend to the connection between the sidewall structure 200 and the pseudo gate 190, a leakage of current caused when the strained region 220 extends to the bottom of the pseudo gate 190 may be avoided. At the same time, when the strained region 220 does not extend to the connection between the sidewall structure 200 and the pseudo gate 190, a width of the channel region between the strained region 220 is relatively large, and a carrier migration rate is reduced, which affects the performances of the semiconductor device. Therefore, through extending the strained region 220 to the connection between the sidewall structure 200 and the pseudo gate 190, electrical properties of the semiconductor device may achieve a best performance. In this embodiment, the strained region 220 is deposited by, for example, a low-temperature epitaxy process. External source gas used in the low-temperature epitaxy process includes germanium gas, silicon gas, hydrogen chloride gas, and hydrogen gas. Through adjusting a ratio of the germanium gas and the silicon source gas, a ratio of germanium in the strained region 220 is adjusted, and the ratio of germanium in the strained region 220 is, for example, from 20% to 40%. Through controlling a germanium content, a lattice constant difference between the strained region 220 and an inner wall of the groove 12 may be reduced, and defects in the strained region 220 may be reduced. After the strained region 220 is formed, the light doping region 210 and the strained region 220 are activated, for example, the substrate 110 is subjected to rapid thermal annealing. Through the rapid thermal annealing, it is possible to repair lattice defects generated during a manufacturing process, activate dopant ions and minimize a diffusion of dopant ions, thereby activating the strained layer and the light doping region. And the rapid thermal annealing can also reduce transient enhanced diffusion.

Figure 12:
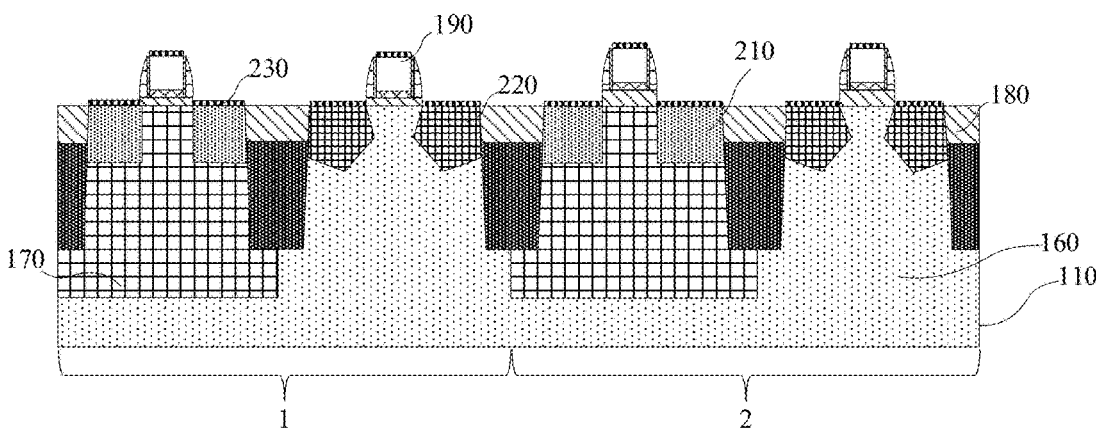
FIG. 12 is a schematic view of a self-aligned block layer in an embodiment.

Please refer to FIG. 12. In an embodiment of the disclosure, a self-aligned block (SAB) 230 is formed on the pseudo gate 190, the light doping region 210 and the strained region 220. Specifically, a metal layer (not shown in the figure) is formed on the dielectric layer 180, the pseudo gate 190, the light doping region 210 and the strained region 220, and the metal layer is, for example, a titanium layer (Ti), a cobalt layer (Co) or a Nickel layer (Ni), etc. Then, the substrate 110 is annealed for the first time. A temperature of the first annealing is, for example, from 300° C. to 350° C., so that metal atoms react with silicon atoms in the pseudo gate 190, the light doping region 210 or the strained region 220 to form an intermediate silicide layer. Then an unreacted metal layer is selectively removed by chemical solution, and the intermediate silicide layer is annealed for the second time. A temperature of the second annealing is higher than the temperature of the first annealing. The temperature of the second annealing is, for example, from 400° C. to 500° C. The intermediate silicide layer is transformed into a silicide layer after annealing, which means the self-aligned block 230. The self-aligned block 230 has good thermal stability, which may reduce a resistance of the device and ensure a good contact with metal electrodes prepared later.

Figure 13:
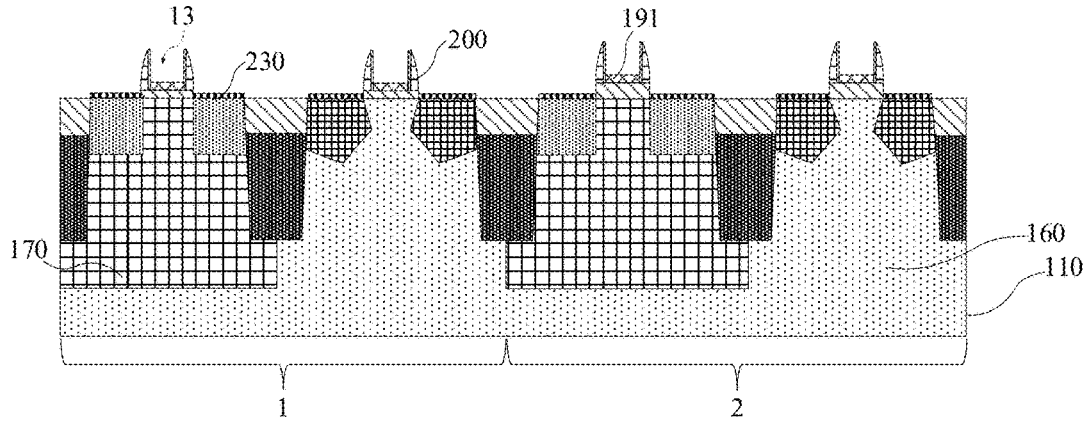
FIG. 13 is a schematic view of removing a polysilicon layer in an embodiment.

Please refer to FIG. 6 and FIG. 13, in an embodiment of the disclosure, after forming the self-aligned block 230, the self-aligned block 230 on a top of the pseudo gate 190 and the polysilicon layer 192 in the pseudo gate 190 are removed, and the protection layer 191 in the pseudo gate 190 is retained so as to form a trench 13, which means that the trench 13 exposes the protection layer 191. When removing the polysilicon layer 192, dry etching, wet etching or a combination of dry etching and wet etching may be used. When dry etching is used, chlorine gas, bromine gas, helium gas, hydrogen bromide gas or a mixed gas of at least one of them with oxygen may be selected, and the dry etching has anisotropy, good selectivity and high etching efficiency. When wet etching is used, tetramethyllammonium hydroxide solution or potassium hydroxide solution may be used to remove the polysilicon layer 192. The wet etching has advantages of simple operation, low requirements on equipment, and easy mass production. During an etching process, the sidewall structure 200 remains, which is used to locate a position of the metal gate and serve as a sidewall structure for the subsequent preparation of the metal gate.

Figure 14:
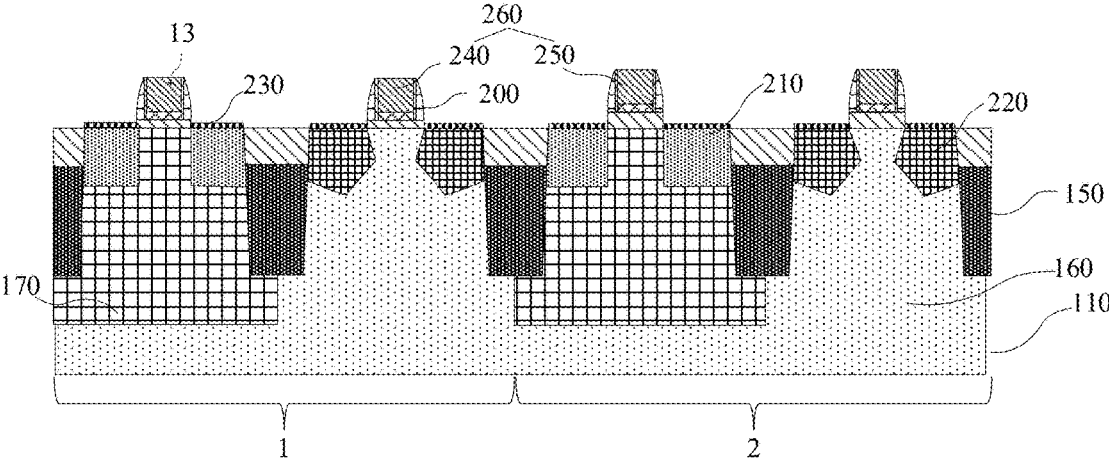
FIG. 14 is a schematic view of a metal gate in an embodiment.
Figure 16:
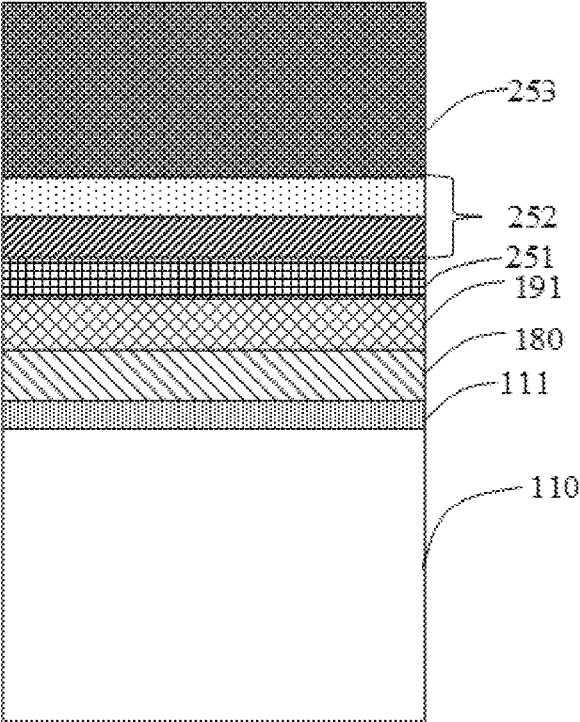
FIG. 16 is a partial schematic structural view of a second metal gate on the substrate in an embodiment.

Please refer to FIG. 14 through FIG. 16, in an embodiment of the disclosure, after the trench 13 is formed, a metal is deposited in the trench 13 to form a metal gate 260, and the metal gate 260 is, for example, a single-layer metal, multi-layer metal or metal compound stacked structure. Wherein, the metal gate 260 includes a first metal gate 240 and a second metal gate 250, the first metal gate 240 is a metal gate of a PMOS transistor, and the second metal gate 250 is a metal gate of an NMOS transistor.

Please refer to FIG. 14 and FIG. 15. In an embodiment of the disclosure, FIG. 15 is a schematic structural view of the first metal gate 240 on the substrate 110. The first metal gate 240 includes the dielectric layer 180, the protection layer 191, a first blocking layer 241, a first work function metal layer 242 and a first metal conductive layer 243. Wherein, the dielectric layer 180 is the dielectric layer with a high dielectric constant, and the protection layer 191 is formed during a process of forming the pseudo gate to reduce damage to the dielectric layer 180. The first blocking layer 241 is formed on the protection layer 191, and a material of the first blocking layer 241 may be a metal compound such as titanium nitride (TiN) or tantalum nitride (TaN) or a stacked layer thereof. In this embodiment, the first blocking layer 241 includes a titanium nitride layer or a tantalum nitride layer, wherein the tantalum nitride layer is arranged on the protection layer 191, and the titanium nitride layer is arranged on the tantalum nitride layer. And the first blocking layer 241 may be formed by methods such as atomic layer deposition, physical vapor deposition or chemical vapor deposition. The first work function metal layer 242 is arranged on the first blocking layer 241, and the first work function metal layer 242 is, for example, a P-type work function metal layer, and its material may be one or a stacked layer of tantalum nitride, titanium nitride, titanium aluminide (TiAl), titanium aluminum nitride (TiAlN) or tungsten nitride (WN). In this embodiment, the first work function metal layer 242 is, for example, a stacked layer of a titanium aluminide layer and a titanium nitride layer, wherein the titanium aluminide layer is arranged on the first blocking layer 241, the titanium nitride is arranged on the titanium aluminide layer, and the first work function metal layer 242 is formed by methods such as plasma enhanced chemical vapor deposition (PECVD), atomic layer deposition or physical vapor deposition. The first metal conductive layer 243 is formed on the first work function metal layer 242, and the first metal conductive layer 243 is, for example, a metal with good conductivity such as tungsten, copper or silver, so as to improve an electrical performance of the transistor. The metal conductive layer 243 is formed by, for example, magnetron sputtering or evaporation deposition. After the first metal conductive layer 243 is formed, a planarization process is performed to improve a flatness of the first metal conductive layer 243.

Please refer to FIG. 14 and FIG. 16. In an embodiment of the disclosure, FIG. 16 is a schematic layer structural view of a second metal gate 250 on the substrate 110 in an embodiment. The second metal gate 250 includes the dielectric layer 180, the protection layer 191, a second blocking layer 251, a second work function metal layer 252 and a second metal conductive layer 253. Wherein, the dielectric layer 180 is the dielectric layer with a high dielectric constant, and the protection layer 191 is formed during the process of forming the pseudo gate to reduce damage to the dielectric layer 180. The second blocking layer 251 is formed on the protection layer 191, and a material of the second blocking layer 251 may be a metal compound such as titanium nitride or tantalum nitride or a stacked layer thereof. In this embodiment, the second blocking layer 251 is, for example, a tantalum nitride layer, and the second blocking layer 251 may be formed by atomic layer deposition, physical vapor deposition or chemical vapor deposition. The second work function metal layer 252 is arranged on the second blocking layer 251, and the second work function metal layer 252 is, for example, an N-type work function metal layer, and its material may be one or a stacked layer of tantalum nitride, titanium nitride, titanium aluminide, titanium aluminum nitride or tungsten nitride. In this embodiment, the second work function metal layer 252 is, for example, a stacked layer of a titanium aluminide layer and a titanium nitride layer, wherein the titanium aluminide layer is arranged on the second blocking layer 251, and the titanium nitride is arranged on the titanium aluminide layer, and the second work function metal layer 252 is formed by, for example, plasma enhanced chemical vapor deposition, atomic layer deposition or physical vapor deposition. The second metal conductive layer 253 is formed on the second work function metal layer 252, and the second metal conductive layer 253 is, for example, a metal with better conductivity such as tungsten, copper or silver, so as to improve the electrical performance of the transistor. The metal conductive layer 253 is formed by, for example, magnetron sputtering or evaporation deposition. After the second conductive metal layer 253 is formed, a planarization process is performed to improve a flatness of the second conductive metal layer 253. In this embodiment, the metal conductive layers of the metal gates of the NMOS transistor and the PMOS transistor may be connected or disconnected, which may be adjusted according to an actual production, and when the metal conductive layers are connected to each other, a height of the metal conductive layer on the shallow trench isolation structure 150 is smaller than a height of the metal conductive layer on the substrate 110, the height of the metal conductive layer on the shallow trench isolation structure 150 is lower than the height of the metal conductive layer on the substrate 110, and a height difference is, for example, equal or higher than 5 nm.

Figure 17:
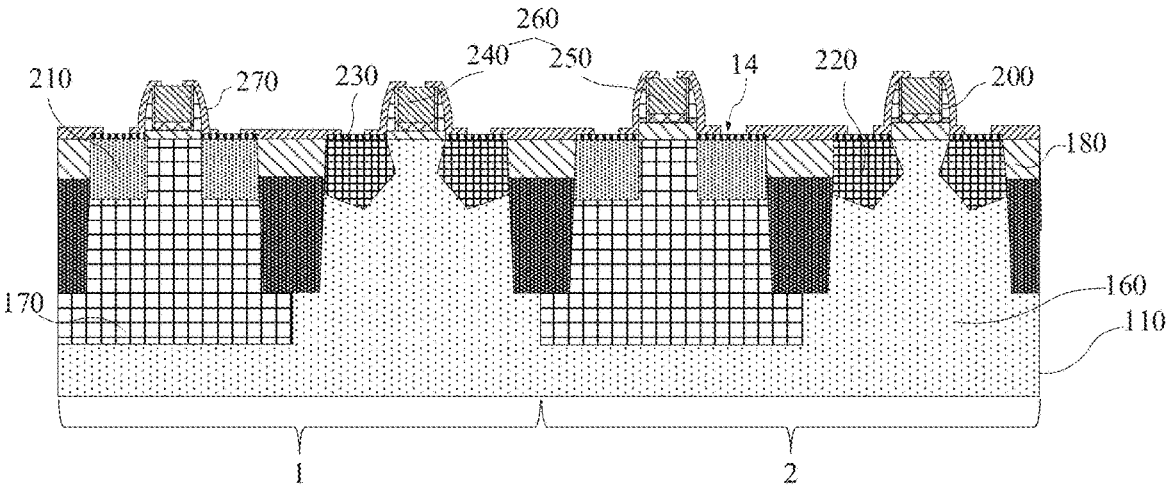
FIG. 17 is a schematic view of a passivation protection layer in an embodiment.

Please refer to FIG. 17. In an embodiment of the disclosure, after the metal gate 260 is formed, a passivation protection layer 270 is formed on a side of the substrate 110 close to the metal gate 260, which means that the passivation protection layer 270 covers the metal gate 260, the dielectric layer 180, the self-aligned block 230 and the sidewall structure 200. Wherein, the passivation protection layer 270 is provided with a second depression part 14 on positions of the metal gate 260 and the self-aligned block 230, exposing the metal gate 260 and the self-aligned block 230, in order to position and connect the metal electrodes. In this embodiment, the passivation protection layer 270 is made of, for example, an insulating material such as silicon oxide or titanium oxide, which may protect the device and improve a withstand voltage property of the device. Through setting the passivation protection layer 270, a duration life of the device may be improved, and the performance of the device may be improved.

Figure 18:
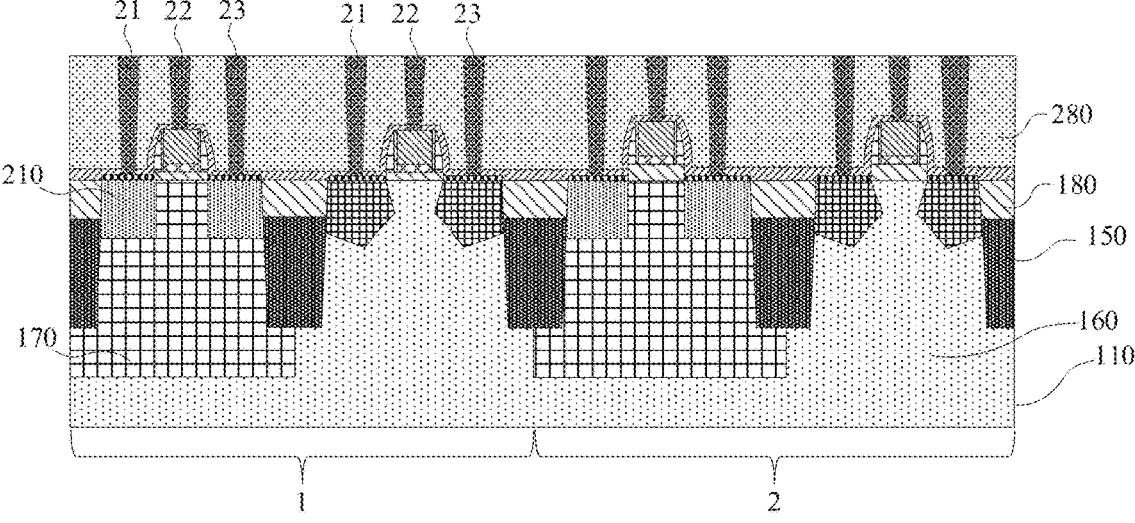
FIG. 18 is a schematic view of a semiconductor device with a PMOS transistor and an NMOS transistor in an embodiment.

Please refer to FIG. 17 through FIG. 18. In an embodiment of the disclosure, an insulating layer 280 is formed on the substrate 110, the insulating layer covers an entire surface of the substrate 110, and the insulating layer 280 is, for example, a silicon oxide layer. After the insulating layer 280 is formed, a planarization process is performed, and a plurality of passages are arranged on the insulating layer 280. The passages are located on the second depression part 14, and the passages expose the metal gate 260 and the self-aligned block 230. Metal wires, such as tungsten, copper or silver, are arranged in the passages to form the electrodes. The electrode includes a source 21, a gate 22 and a drain 23, wherein the source 21 is located on one side of the metal gate 260 and is connected with the self-aligned block 230. The gate 22 is arranged on the metal gate 260 and connected with the metal conductive layer of the metal gate 260. The drain 23 is arranged on the other side of the metal gate 260 and connected with the self-aligned block 230.

In summary, the disclosure provides the semiconductor device and the manufacturing method thereof. Before forming the pseudo gate, the dielectric layer is formed to improve the electrical performance of the semiconductor device, which increases the effective width of the semiconductor device and the performances of the semiconductor device. It also improves the performance of semiconductor devices with different functions on the same substrate to obtain high-quality semiconductor devices.

The embodiments of the disclosure described above are only used to help illustrate the disclosure. The embodiments do not exhaustively describe all the details, nor do they limit the disclosure to the specific embodiments described. Obviously, many modifications and variations are possible according to this specification. The embodiments are specifically described in the specification in order to better explain the principles and practical applications of the disclosure, so that those skilled in the art can well understand and utilize the disclosure. The disclosure is limited only by the claims and their full scope and equivalents.

What is claimed is:

1. A semiconductor device, comprising:
   a substrate, comprising a first region and a second region;
   a shallow trench isolation structure, arranged on the first region and the second region, a bottom surface of the shallow trench isolation structure being lower than a top surface of the substrate and a concaved opening being forming in the shallow trench isolation structure,
   a dielectric layer, arranged in the opening and on the substrate, and a height of the dielectric layer in the second region being greater than that in the first region;
   a gate, arranged on the dielectric layer;
   a source, arranged on the substrate and located on a first side of the gate; and
   a drain, arranged on the substrate and located on a second side of the gate;
   wherein a pad oxide layer is provided on the substrate, the shallow trench isolation structure is a concaved structure concaved from a top surface of the pad oxide layer to an inside of the substrate, the shallow trench isolation structure is filled with an isolation medium at first, then the opening is obtained through extending an etching time of removing the pad oxide layer on the substrate to remove part of the isolation medium in the shallow trench isolation structure, so the opening is formed inside the shallow trench isolation structure and above a retained part of the isolation medium; a top surface of the retained part of the isolation medium in the shallow trench isolation structure are 10 nm to 30 nm lower than the top surface of the substrate; removing part of the isolation medium, removing the pad oxide layer, and forming the opening are performed in a same process through extending the etching time.

2. The semiconductor device according to claim 1, wherein
   the semiconductor device further comprises a sidewall structure, the sidewall structures are located on both sides of the gate, and the sidewall structures are located on the dielectric layer.

3. The semiconductor device according to claim 2, wherein
   the sidewall structure is a single insulating layer or a stacked structure of an insulating layer with a strained layer.

4. The semiconductor device according to claim 2, wherein
   the semiconductor device further comprises a passivation protection layer, and the passivation protection layer is arranged on the gate, the sidewall structure and the dielectric layer.

5. The semiconductor device according to claim 2, wherein the gate comprises a first metal gate, and a strained region is arranged in the substrate on both sides of the first metal gate.

6. The semiconductor device according to claim 5, wherein the strained region extends toward a bottom of the first metal gate and extends to a connection between the sidewall structure and the first metal gate.

7. The semiconductor device according to claim 6, wherein the gate comprises a second metal gate, and a light doping region is arranged in the substrate on both sides of the second metal gate.

8. The semiconductor device according to claim 1, wherein a thickness of the dielectric layer in the first region is from 2 nm to 5 nm, and a thickness of the dielectric layer in the second region is from 4 nm to 8 nm.

9. The semiconductor device according to claim 1, wherein the gate is a single-layer metal, a multi-layer metal, or a stacked structure of a metal with a metal compound.

10. The semiconductor device according to claim 7, wherein after the opening is formed, a high dielectric constant material is deposited in the opening and on the substrate to form the dielectric layer, after the dielectric layer is formed, a pseudo gate is formed on the dielectric layer, the pseudo gate comprises a protection layer, a polysilicon layer, a shielding layer and an anti-reflection layer, the protection layer is formed on a bottom of the pseudo gate, and when the polysilicon layer in the pseudo gate is removed, the protection layer in the pseudo gate is retained so as to form a trench exposing the protection layer.

11. The semiconductor device according to claim 10, wherein the light doping region is located between the sidewall structure and the shallow trench isolation structure and is adjacent to the sidewall structure and the shallow trench isolation structure.

12. The semiconductor device according to claim 11, wherein after the shallow trench structure is manufactured, an ion implantation is performed on the substrate to form a first well region and a second well region, then after forming the light doping region, the dielectric layer on the shallow trench isolation structure, the first well region, and the second well region is removed, and the dielectric layer in an area covered by the pseudo gate and the sidewall structure remains, the dielectric layer in the opening remains, and the dielectric layer in the opening is flush with the substrate.

13. The semiconductor device according to claim 12, wherein after removing the dielectric layer, a groove is formed on the first well region, a sidewall of the groove is arranged in an open polygon, a semiconductor material is deposited in the groove to form the strained region, a shape of the strained region is consistent with a shape of the groove, one side of the polygon is adjacent to the shallow trench isolation structure, and the strained region extends to a bottom of the pseudo gate and extends to a connection between the sidewall structure and the pseudo gate.

14. The semiconductor device according to claim 13, wherein the polygon is a pentagon.

15. The semiconductor device according to claim 12, wherein a self-aligned block is formed on the pseudo gate, after the trench is formed, a metal is deposited in the trench to form a metal gate, after the metal gate is formed, a passivation protection layer is formed on a side of the substrate close to the metal gate, the passivation protection layer is provided with a depression part on positions of the metal gate, and the self-aligned block, exposing the metal gate and the self-aligned block, is configured to position and connect metal electrodes.

16. The semiconductor device according to claim 15, wherein the protection layer is titanium nitride and is configured to prevent the dielectric layer from being polluted or damaged in a subsequent preparation process and improve a performance of the metal gate prepared subsequently.

\* \* \* \* \*